(12) United States Patent
Walsh et al.

(10) Patent No.: US 7,379,299 B2
(45) Date of Patent: May 27, 2008

(54) NOISEPROOFED AND VENTILATED ENCLOSURE FOR ELECTRONICS EQUIPMENT

(75) Inventors: Tim Walsh, Marlow Buckinghamshire (GB); David O'Coimin, Bristol (GB)

(73) Assignee: Kell Systems, Marlow Bucks (GB)

( * ) Notice: Subject to any disclaimer, the term of this patent is extended or adjusted under 35 U.S.C. 154(b) by 20 days.

(21) Appl. No.: 11/489,785

(22) Filed: Jul. 20, 2006

(65) Prior Publication Data

US 2007/0218826 A1 Sep. 20, 2007

Related U.S. Application Data

(60) Provisional application No. 60/783,233, filed on Mar. 17, 2006.

(51) Int. Cl.
*H05K 7/20* (2006.01)
*H05K 5/00* (2006.01)
*G10K 11/04* (2006.01)

(52) U.S. Cl. .................. 361/695; 181/198; 181/200; 181/225; 454/184; 454/906; 361/692

(58) Field of Classification Search ............ 361/687, 361/690, 692, 694–695; 181/198, 200–201, 181/224–225; 464/184, 262, 346, 906; 165/80.3, 121–122, 135
See application file for complete search history.

(56) References Cited

U.S. PATENT DOCUMENTS

| | | | |
|---|---|---|---|
| 2,701,618 A * | 2/1955 | Montgomery | 181/201 |
| 4,035,711 A * | 7/1977 | Piller | 363/174 |
| 4,600,326 A | 7/1986 | Fudatsuji et al. | |
| 4,665,466 A | 5/1987 | Green | |
| 4,702,145 A | 10/1987 | Kannapell et al. | |
| 4,797,783 A | 1/1989 | Kohmoto et al. | |
| 5,040,095 A | 8/1991 | Beaty et al. | |
| 5,216,579 A | 6/1993 | Basara et al. | |
| 5,332,872 A * | 7/1994 | Ewanek | 181/224 |
| 5,440,450 A | 8/1995 | Lau et al. | |
| 5,452,362 A * | 9/1995 | Burward-Hoy | 381/71.5 |
| 5,526,228 A | 6/1996 | Dickson et al. | |
| 5,544,012 A | 8/1996 | Koike | |
| 5,894,407 A | 4/1999 | Aakalu et al. | |
| 5,917,698 A | 6/1999 | Viallet | |
| 5,949,646 A | 9/1999 | Lee et al. | |
| 5,978,217 A | 11/1999 | Kerrigan et al. | |

(Continued)

OTHER PUBLICATIONS

Kell Systems website pages as retrieved Aug. 2004 from http://www.kellsystems.co.uk/html/homepage.htm.

*Primary Examiner*—Jayprakash N Gandhi
*Assistant Examiner*—Robert Hoffberg
(74) *Attorney, Agent, or Firm*—Wilmer Cutler Pickering Hale and Dorr LLP (57) ABSTRACT

A system and method are disclosed for enclosing electronic equipment in a noiseproofed and ventilated enclosure. This includes supplying air to an enclosure and removing air from the enclosure through acoustic chambers attached to the enclosure. The acoustic chambers can be constructed of materials or be treated with materials that have noise-absorbing or noise-abating properties. In addition, the acoustic chambers can contain baffles that prevent noise that has entered the acoustic chamber from leaving the chamber. And, the system and method can use a cable egress port that allows cables and wiring to pass through the egress port while blocking the transmission of noise through the egress port.

22 Claims, 6 Drawing Sheets

U.S. PATENT DOCUMENTS

| | | | |
|---|---|---|---|
| 6,082,441 | A | 7/2000 | Boehmer et al. |
| 6,086,476 | A | 7/2000 | Paquin et al. |
| 6,088,225 | A | 7/2000 | Parry et al. |
| 6,104,003 | A | 8/2000 | Jones |
| 6,104,608 | A | 8/2000 | Casinelli et al. |
| 6,151,210 | A | 11/2000 | Cercioglu et al. |
| 6,186,890 | B1 | 2/2001 | French et al. |
| 6,198,627 | B1 * | 3/2001 | Roehling et al. ............ 361/688 |
| 6,315,656 | B1 * | 11/2001 | Pawlowski .................. 454/184 |
| 6,381,134 | B2 | 4/2002 | Iwasaki |
| 6,459,578 | B1 * | 10/2002 | Wagner ...................... 361/694 |
| 6,459,579 | B1 | 10/2002 | Farmer et al. |
| 6,481,527 | B1 | 11/2002 | French et al. |
| 6,544,309 | B1 | 4/2003 | Hoefer et al. |
| 6,592,448 | B1 | 7/2003 | Williams |
| 6,594,148 | B1 | 7/2003 | Nguyen et al. |
| 6,618,248 | B1 | 9/2003 | Dalheimer |
| 6,643,130 | B1 | 11/2003 | DeMarchis et al. |
| 6,702,661 | B1 | 3/2004 | Clifton et al. |
| 6,704,196 | B1 | 3/2004 | Rodriguez et al. |
| 6,742,583 | B2 | 6/2004 | Tikka |
| 6,745,149 | B2 | 6/2004 | Beeten |
| 6,816,372 | B2 * | 11/2004 | Huettner et al. ............ 361/695 |
| 6,889,752 | B2 | 5/2005 | Stoller |
| 6,927,977 | B2 | 8/2005 | Singer |
| 6,951,513 | B1 | 10/2005 | Greenslade et al. |
| 6,987,673 | B1 | 1/2006 | French et al. |
| 7,027,301 | B2 | 4/2006 | Merlet |
| 7,074,123 | B2 | 7/2006 | Bettridge et al. |
| 7,238,104 | B1 * | 7/2007 | Greenslade et al. ........ 454/184 |
| 2005/0161280 | A1 | 7/2005 | Furuya |
| 2006/0002084 | A1 | 1/2006 | Wei |
| 2006/0054380 | A1 | 3/2006 | Doll |
| 2006/0104027 | A1 | 5/2006 | Vinson et al. |
| 2006/0120045 | A1 | 6/2006 | Van Der Werff |
| 2006/0148398 | A1 | 7/2006 | Ruch et al. |
| 2007/0139882 | A1 * | 6/2007 | Bartell et al. ................ 361/695 |
| 2007/0274036 | A1 * | 11/2007 | Walsh et al. ................. 361/688 |

* cited by examiner

NOISEPROOFED AND VENTILATED ENCLOSURE FOR ELECTRONICS EQUIPMENT

RELATED APPLICATIONS

This application claims the benefit of priority under 35 U.S.C. § 119(e) from U.S. Provisional Application Ser. No. 60/783,233 filed Mar. 17, 2006, entitled "Soundproofed, Ventilated Enclosure for Electronics Equipment," which is incorporated herein by reference.

FIELD OF THE INVENTION

The present invention relates to enclosures for electronics equipment. More particularly, the present invention relates to enclosures for electronic equipment that have the capability to ventilate the electronic equipment contained in the enclosure and reduce noise emanating from the enclosure.

BACKGROUND OF THE INVENTION

The amount of electronic equipment found in the office and home has increased dramatically in recent years. For example, in an office environment, the use of server computers is commonplace. Likewise, high-speed Internet access is becoming increasingly available, adding to the amount of electronic equipment in use in the office environment, e.g. T1 or T3 connectivity equipment, ADSL or cable modems, Ethernet routers, and WiFi access points. It is generally desirable to concentrate such equipment in a single location. Therefore, co-locating servers, network hardware, and other equipment simplifies the care for and maintenance of this equipment.

As the speed and power of today's computer and electronic equipment has increased, so has the amount of "noise" and heat produced by such equipment. This is in part due to the physical size of the various devices becoming smaller and smaller which further complicates cooling the computer and electronic equipment. This is realized by there being less surface area available for heat exchange. This means that there must be increased airflow through the equipment casing to effect cooling. The amount of noise also is increased because the cooling equipment is more powerful, to provide greater capacity, and such cooling equipment also generates more noise.

The noise from the fans and airflow is compounded by the concentration of equipment in a single location. Further, there have been attempts to decrease noise by placing equipment in sealed enclosures. However, this attempt to trap noise also trapped heat in the sealed enclosure that was generated by the equipment. The inability to remove the trapped heat has induced equipment failure. To combat this, modern enclosures have been vented in an attempt to provide adequate airflow to the equipment. Venting the enclosure allows much of the noise created by computers and electronic equipment to escape the enclosure.

A perceived solution to the noise problem was to provide a dedicated electronic equipment room, e.g., a dedicated server room. These rooms are very often sealed and provided with a separate air conditioning system to remove the heat created by the equipment and maintain a temperature for safe operation of the equipment. Depending on the amount of equipment and size of the room, they can also include noise abatement measures. However, there are a number of drawbacks to this solution. Providing a dedicated electronic equipment room is expensive and often requires valuable office space to be sacrificed. In addition, although noise levels can be reduced outside the dedicated equipment room, the noise level in the dedicated equipment room can be quite high. This can create an unpleasant, and sometime harmful, environment for those who must work on or with the electronic equipment.

Similar problems with noise were encountered in the home environment. As the amount of audio and video equipment in the home increases, so does the level of noise produced by the need to cool such equipment. For example, a common home theater system often includes one or more of the following items: a cable signal converter box, a satellite video tuner, a video cassette recorder (VCR), digital video recorder (DVR), a digital video disc (DVD) player, an audio tuner/amplifier system, and/or a media PC. Many people find this vast collection of electronic equipment unsightly.

To alleviate the problem, many home theater owners sought to hide the electronic equipment inside of enclosures or furniture. These owners encounter similar problems with heat and noise as do offices. Some home theater equipment is cooled by natural convection rather than forcing air through the equipment casing with cooling fans. When equipment is placed in an enclosure, heat is trapped, which can lead to equipment failure or a reduction of equipment life.

There is a need for a system and method that provides better noise and heat reduction for electronic equipment. The present invention overcomes the problems of the past by providing a novel system and method as set forth in the remainder of this specification referring to the attached drawings.

SUMMARY OF THE INVENTION

The present invention is directed to systems and methods for housing electronic equipment that provides increased advantages in noise and heat reduction. An embodiment of the present invention includes an enclosure housing that has ventilation openings for the ingress and egress of cooling air. The enclosure housing may have acoustic chambers attached to it through which cooling air passes. The acoustic chambers of the embodiment are constructed of materials or are treated with materials that have noise-absorbing properties. In addition, the acoustic chambers can contain baffles that drastically reduce the amount of noise leaving the chamber. This embodiment also uses a cable egress port to allow cables and wiring to pass into and out of the enclosure housing while blocking the transmission of noise through the egress port.

Another embodiment of the present invention includes an intake module that may be attached to the enclosure housing. This will permit air from outside the enclosure to flow into the enclosure through the intake module while reducing noise traveling in a direction opposite the airflow. The embodiment may also include an exhaust module attached to the enclosure housing that allows air to flow from the enclosure through the exhaust module to the outside of the enclosure, again while reducing noise traveling in the same direction as the air flow. The embodiment can further include a cable egress port joined to walls of the enclosure. The cable egress port allows cables and wiring to pass into the enclosure from outside the enclosure while blocking the transmission of noise through the egress port.

Yet a further embodiment of the present invention includes a ventilated housing for electronic equipment that abates noise generated by the electronic equipment disposed therein. The housing including a housing structure that is capable of being closed except for at least one air ingress opening and at least one air egress opening. The housing also includes an air intake structure further comprising an intake inlet for receiving outside air therethrough and an intake internal chamber in fluid communications with the intake inlet and an intake outlet. The intake outlet exhausts air from the intake internal chamber and passes said air into the housing structure, with the intake outlet being aligned with the housing air ingress opening. The intake internal chamber has at least one intake baffle disposed and positioned within the intake internal chamber such that noise emanating from within the housing structure is substantially abated from exiting through the intake inlet. The housing also includes an air exhaust structure further comprising an exhaust inlet having at least a portion that extends into the housing structure, with the exhaust inlet for receiving air passing from within the housing structure, and with the exhaust inlet further having a portion disposed at a first angle to a horizontal plane extending through the housing structure and aligned with the housing air egress opening. The air exhaust structure also includes an exhaust internal chamber in fluid communications with the exhaust inlet and an exhaust outlet; the exhaust outlet exhausts air from the exhaust internal chamber and passes air outside the air exhaust structure. The exhaust internal chamber has at least one funnel-shaped baffle arrangement disposed and positioned within the exhaust internal chamber, the baffle arrangement including at least two non-overlapping exhaust baffles, each exhaust baffle being separately connected to the exhaust internal chamber and respectively being disposed at a second and third angle to the horizontal plane extending through the housing structure, with the exhaust baffles having lower and upper ends. The separate lower ends are distal to the exhaust inlet and spaced a first predetermined distance apart. The separate upper ends are proximal to the exhaust inlet and spaced apart a second predetermined distance that is greater than the first predetermined distance. The exhaust baffles are disposed such that noise emanating from within the housing structure is abated from exiting through the exhaust outlet. The housing further includes noise-abating material disposed on at least a portion of at least one of the intake baffle, the funnel-shaped baffle arrangement, walls of the intake internal chamber, walls of the exhaust internal chamber, or internal walls of the housing structure for abating noise emanating from the housing structure. The housing also includes a device associated with the air intake, air exhaust, or housing structures for moving air between the outside of the housing structure and the inside of the housing structure through the air ingress opening.

The present invention will now be described in greater detail in the remainder of the specification referring to the attached drawings.

These and other aspects of the present invention will be described in detail in the remainder of the specification, claims, and attached drawings.

DETAILED DESCRIPTION OF THE DRAWINGS

The present invention is directed to systems and methods for enclosing electronic equipment in a ventilated, noise reducing enclosure. The enclosure of the present invention provides for ingressing air into an enclosure and egressing air from the enclosure through at least acoustic chambers associated with the enclosure. The acoustic chambers may be constructed of materials or be treated with materials that have noise-absorbing properties. In addition, the acoustic chambers may include baffles that prevent noise that entered the acoustic chamber from leaving. It is within the scope of the present invention that embodiments of the present invention can use a cable egress port that allows cables and wiring to pass through the egress port while blocking the transmission of noise through the egress port.

Figure 1:
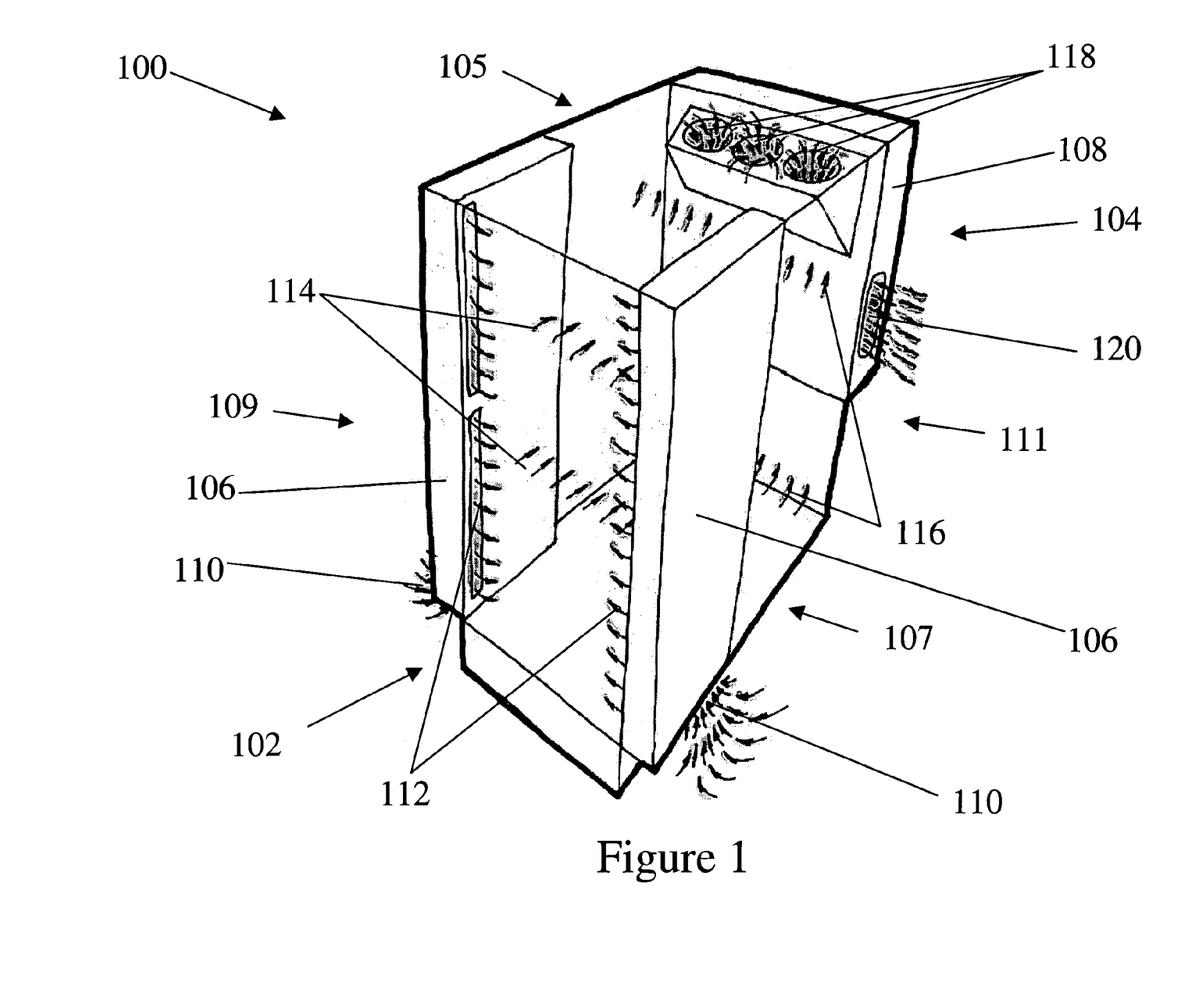
FIG. 1 shows a perspective view of an enclosure having features in accordance with an embodiment of the present invention.

FIG. 1, generally at 100, shows an embodiment of the present invention. Enclosure 100 is generally boxed-shaped, having six sides, including a front side 102, a rear side 104, a roof 105, a floor 107, a left side 109, and a right side 111. Enclosure 100 can be an equipment rack with dimensions sized to comply with the Electronic Industries Alliance 19" rack specifications (e.g., EIA™-310-D). For purposes of illustration, portions of enclosure 100 are shown as transparent in order to aid understanding. However, it is understood that enclosure 100 can be constructed of various materials, for example, wood, metal, or medium density fiberboard covered with a wood, plastic, or metal laminate. In the embodiment, portions of the inside walls of enclosure 100 may be coated with materials that have noise-absorbing or noise-abating properties. Examples of materials useful for this purpose include anti-resonant polymeric damping materials (for absorbing vibration) and/or polyurethane foam (such as that sold commercially as PYROSORB Flame Resistant Acoustic Foam). Preferably, the polyurethane foam can be either flat foam (e.g., foam of 10 mm or 25 mm uniform thickness) or "egg box" foam. Examples of anti-resonant polymeric damping materials include TS3 1.8 mm thick chlorinated polyethylene (CPE) flexible polymeric damping sheet used in the automotive industry. The damping sheet may have adhesive backing to increase the ease of application. Other examples include one or a combination of polymer foams, fiberglass, carpet, and other anti-resonance sheet materials. Coating portions of the inside walls of enclosure 100 with anti-resonant materials helps to reduce the amount of noise transmitted to the walls of enclosure 100, thereby reducing the amount of noise passed to the outside of enclosure 100 by the walls.

Electronic equipment (not shown) can be disposed in enclosure 100 and can rest on floor 107 or can reside on shelves (not shown in FIG. 1) located in enclosure 100. Enclosure 100 has acoustic chambers in the form of two air intake modules 106 positioned adjacent to front side 102 and an exhaust module 108 positioned near the top of rear side 104. Intake modules 106 and exhaust module 108 may be connected to enclosure 100 in such a manner that preferably air will enter enclosure 100 near front side 102 and exit near rear side 104 when cooling fans are in operation. Intake modules 106 and exhaust module 108 may be connected to enclosure 100 by friction grip connectors that allow for removal and replacement of intake modules 106 and exhaust module 108 without the use of tools, or the modules may be fixedly.

In FIG. 1, the sets of small arrows generally illustrate the direction of airflow through enclosure 100. According to the embodiment shown, air is drawn into bottom intake inlets 110 of intake modules 106. This air then passes through the interior of intake modules 106 and enters enclosure 100 through vertical intake outlets 112. The air passes generally front to back, as shown by arrows 114, and passes through and/or around electronic equipment located in the central portion of enclosure 100, thereby cooling to the equipment. The air shown at 112 and 114 travels to and up rear side 104, as shown by arrows 116, toward exhaust inlets 118 in exhaust module 108. After passing through the interior of exhaust module 108, the air exits exhaust module 108 through exhaust outlets 120. Although only one exhaust outlet is shown in FIG. 1, a plurality of exhaust outlets may be available, such as the one located on the opposite side of exhaust module 108.

Figures 2, 3:
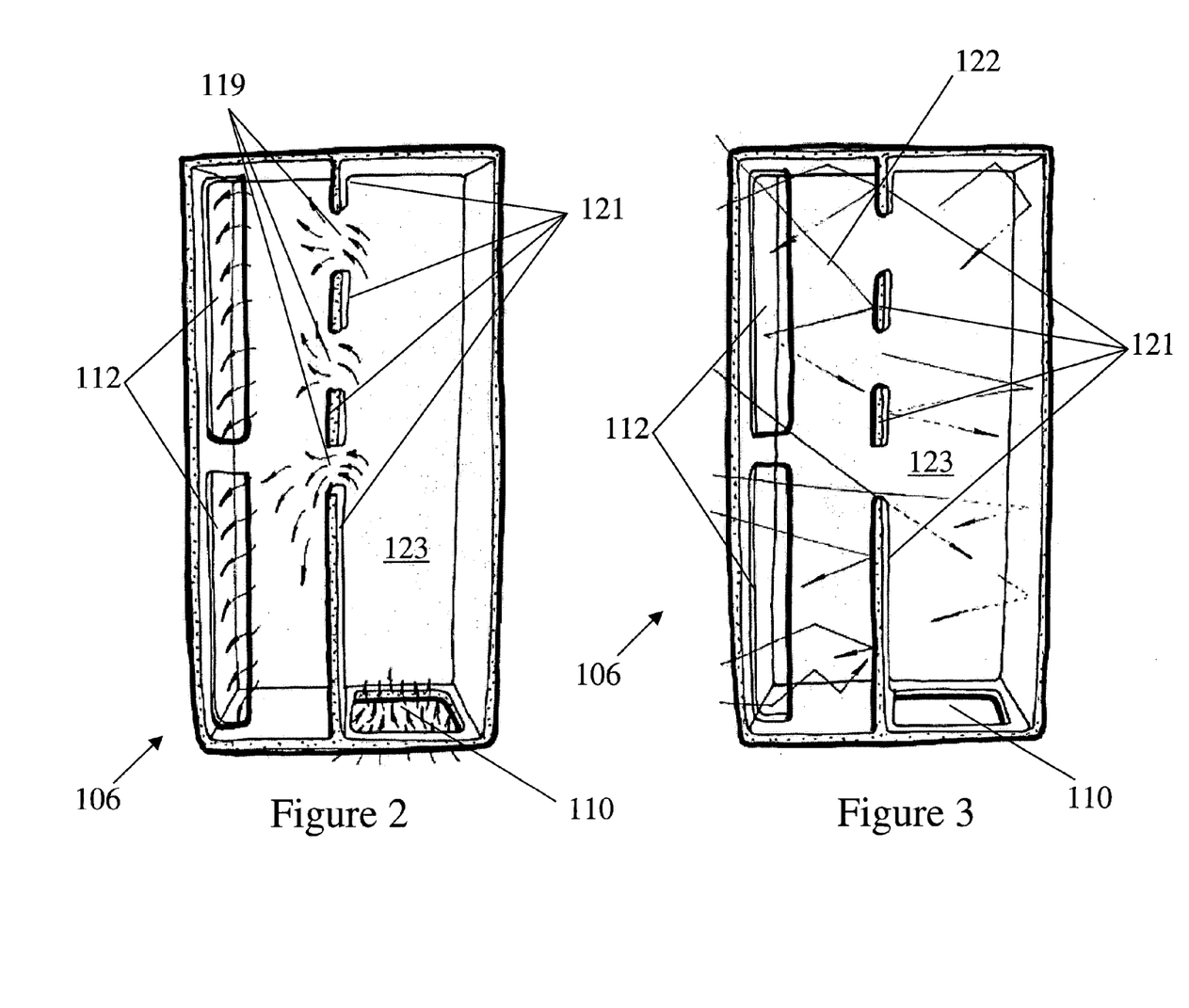
FIG. 2 shows an internal side view of an intake module constructed according to an embodiment of the present invention illustrating airflow through the module.
FIG. 3 shows an internal side view of an intake module constructed according to an embodiment of the present invention illustrating noise reflections within the module.

FIG. 2 shows a side view of left intake module 106 of FIG. 1 with a right-side wall 123 shown as transparent, illustrating airflow through the interior of intake module 106. As in FIG. 1, small arrows generally illustrate airflow through inlet module 106. As explained above, air enters intake module 106 through intake inlet 110. Although a single intake inlet 110 is shown on the bottom of intake module, intake inlet 110 can be located elsewhere on intake module 106. In addition, more than one inlet can be provided, e.g., another intake inlet can be provided on the top of intake module 106 (not shown). In this embodiment, intake module 106 includes internal baffles 121, explained in detail below. The airflow continues past internal baffles 121, through baffle apertures 119, and exits intake module 106 through vertical intake outlets 112. Intake outlets 112 are positioned to convey the air to front side 102 of enclosure 100. Intake outlets 112 are shown as rectangular openings having a generally vertical orientation. Intake outlets 112 can include other shapes, e.g., a series of round openings positioned adjacent front side 102 of enclosure 100. In this embodiment, the combined aperture size of intake outlets 112 is greater than or equal to the aperture size of the intake inlet 110. Likewise, the combined aperture size of baffle apertures 119 is greater than or equal to the aperture size of the intake inlet 110.

FIG. 3 shows the side view of intake module 106 of FIG. 2, illustrating exemplary noise reflections within intake module 106. Multi-segmented arrows generally illustrate example noise paths through intake module 106 and show noise reflections off the interior walls of intake module 106. The walls of intake module 106 can be constructed of materials or can be treated with materials that have noise-absorbing, noise-abating, and/or noise-reflecting properties. For example, the interior surface of the walls may be coated with one or a combination of polymer foams, polyurethane egg box foam, fiberglass, self-adhesive rubber sheeting, carpet, and anti-resonance sheet materials.

Internal baffles 121 are disposed within intake module 106 to reduce the amount of noise from passing from intake outlets 112 to intake inlets 110. As an illustration, internal baffles 121 may be positioned to cause noise traveling from intake outlets 112 to intake inlet 110 to reflect many times off of the internal baffles 121 and inside walls of intake module 106. One illustrative arrangement of internal baffles 121 prevents a line of sight between intake outlets 112 and intake inlet 110. Internal baffles 121 can be constructed of or treated with materials having noise-absorbing properties as described above.

An example noise path 122 shows noise entering intake module 106 through intake outlet 112 and reflecting off one of internal baffles 121. The noise further reflects off the interior surface of the wall of intake module 106. In this example, because the interior surface of intake module 106 and the surface of internal baffles 121 are treated with noise-absorbing material, the noise loses energy with each reflection. If the noise eventually exits through intake inlet 110, its energy, and therefore its volume, is greatly reduced. In this way, various embodiments of the present invention provide for the free-flow of air into enclosure 100 while reducing noise from escaping enclosure 100. In addition, although not required, intake inlet 110 is downward facing. This orientation of intake inlet 110 causes the noise to reflect off of the ground, and in some instances, reflect back into intake module 106 through intake inlet 110, further reducing the amount of noise escaping enclosure 100.

Figure 4:
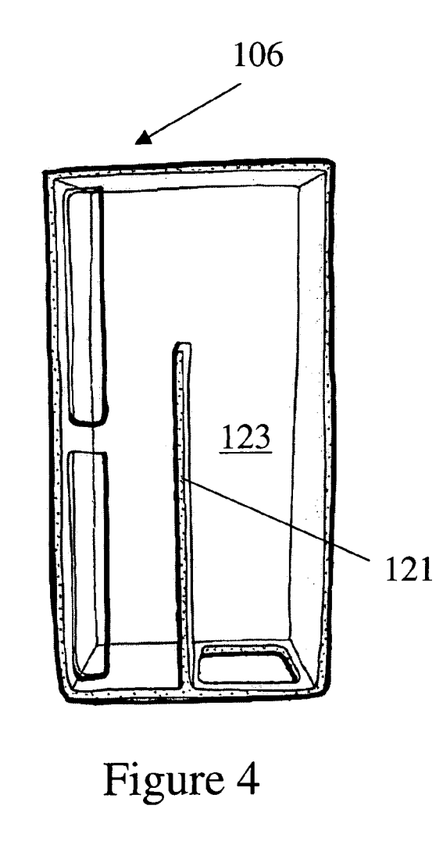
FIG. 4 shows an internal side view of an intake module constructed according to an embodiment of the present invention illustrating an alternate baffle arrangement.
Figure 5:
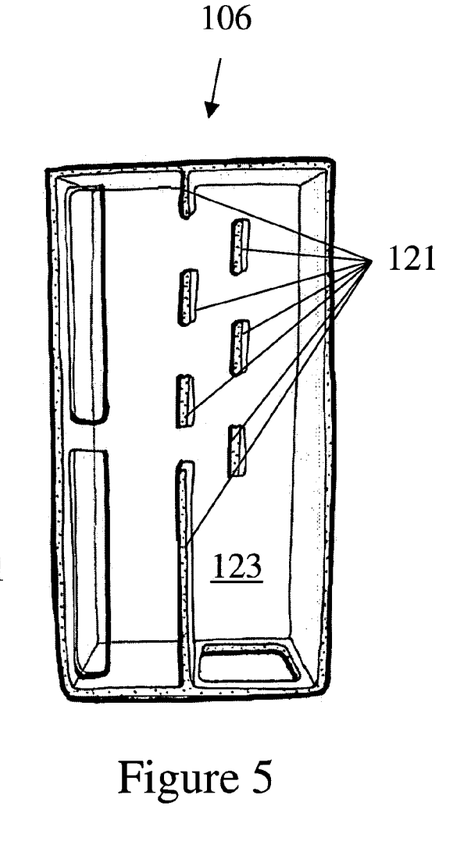
FIG. 5 shows an internal side view of an intake module constructed according to an embodiment of the present invention illustrating an alternate baffle arrangement.
Figure 6:
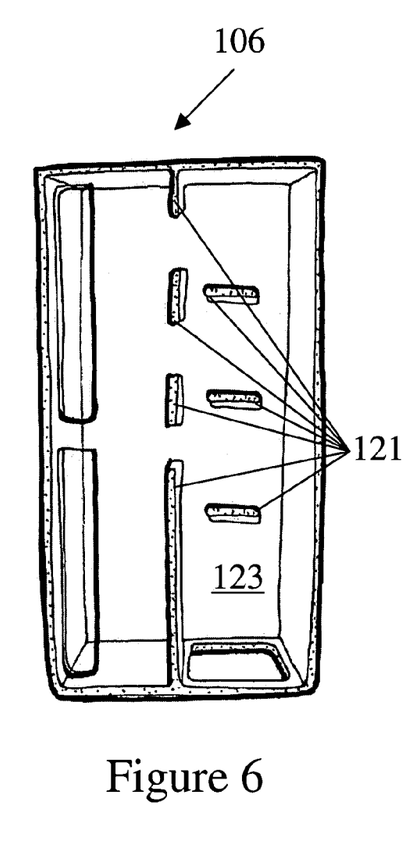
FIG. 6 shows an internal side view of an intake module constructed according to an embodiment of the present invention illustrating an alternate baffle arrangement.

The arrangement of internal baffles 121 that is shown in FIGS. 2 and 3 is meant only to be an illustration of baffles usable by the system and method of the present invention; however, it is understood that multiple baffles may be used and still be within the scope of the present invention. FIGS. 4, 5, and 6 show alternative baffle arrangements for use in the present invention. FIG. 4 shows a single internal baffle 121 that extends upward from a floor of intake module 106. FIG. 5 shows an internal baffle 121 arrangement that has more than one row of internal baffles 121. FIG. 6 shows that the internal baffles 121 can have both vertical and horizontal orientations.

Figure 7:
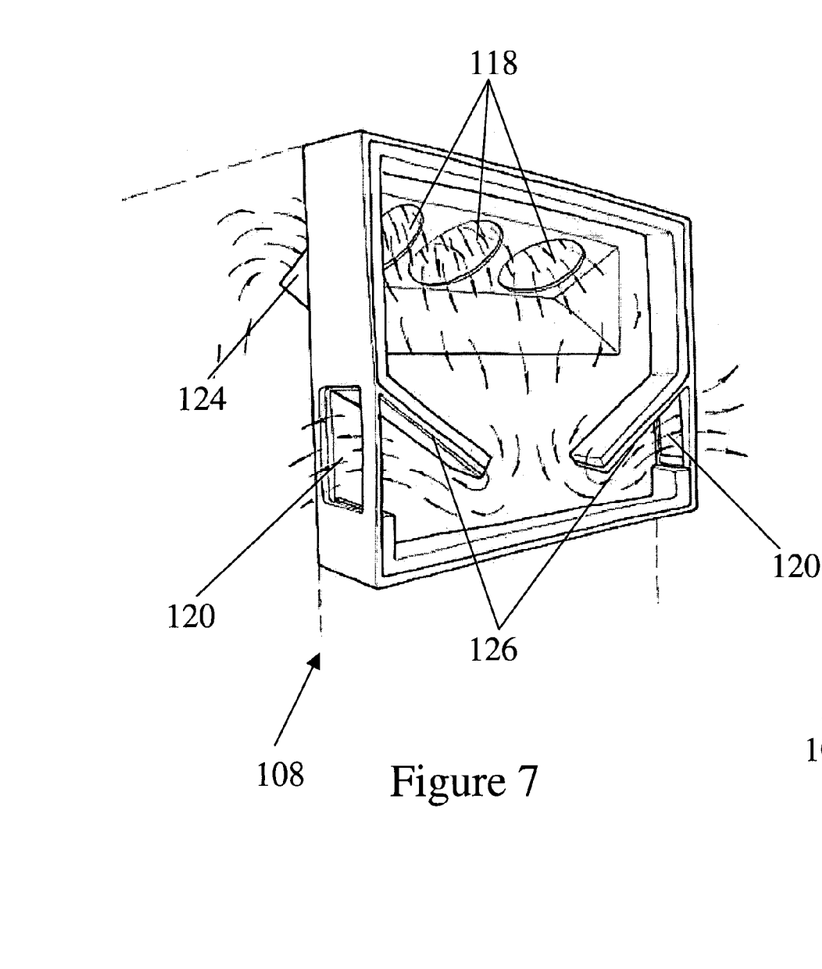
FIG. 7 shows a cut-away perspective view of an exhaust module constructed according to an embodiment of the present invention illustrating airflow through the module.

FIG. 7 shows a cut-away perspective view of exhaust module 108 of the embodiment, illustrating airflow through the interior of exhaust module 108. Small arrows generally illustrate airflow through exhaust module 108. Air from adjacent enclosure 100 enters exhaust module 108 through exhaust inlets 118. After the air enters exhaust module 108, the air passes between and then beneath internal baffles 126 and exits through exhaust outlets 120. Three exhaust inlets 118 are shown in FIG. 7, however, it is understood that more or less than three inlets may be used and still be within the scope of the present invention. Although not shown in FIG.

7, fans can be mounted in exhaust inlets 118 to draw air from enclosure 100 into exhaust module 108.

Figures 9, 10:
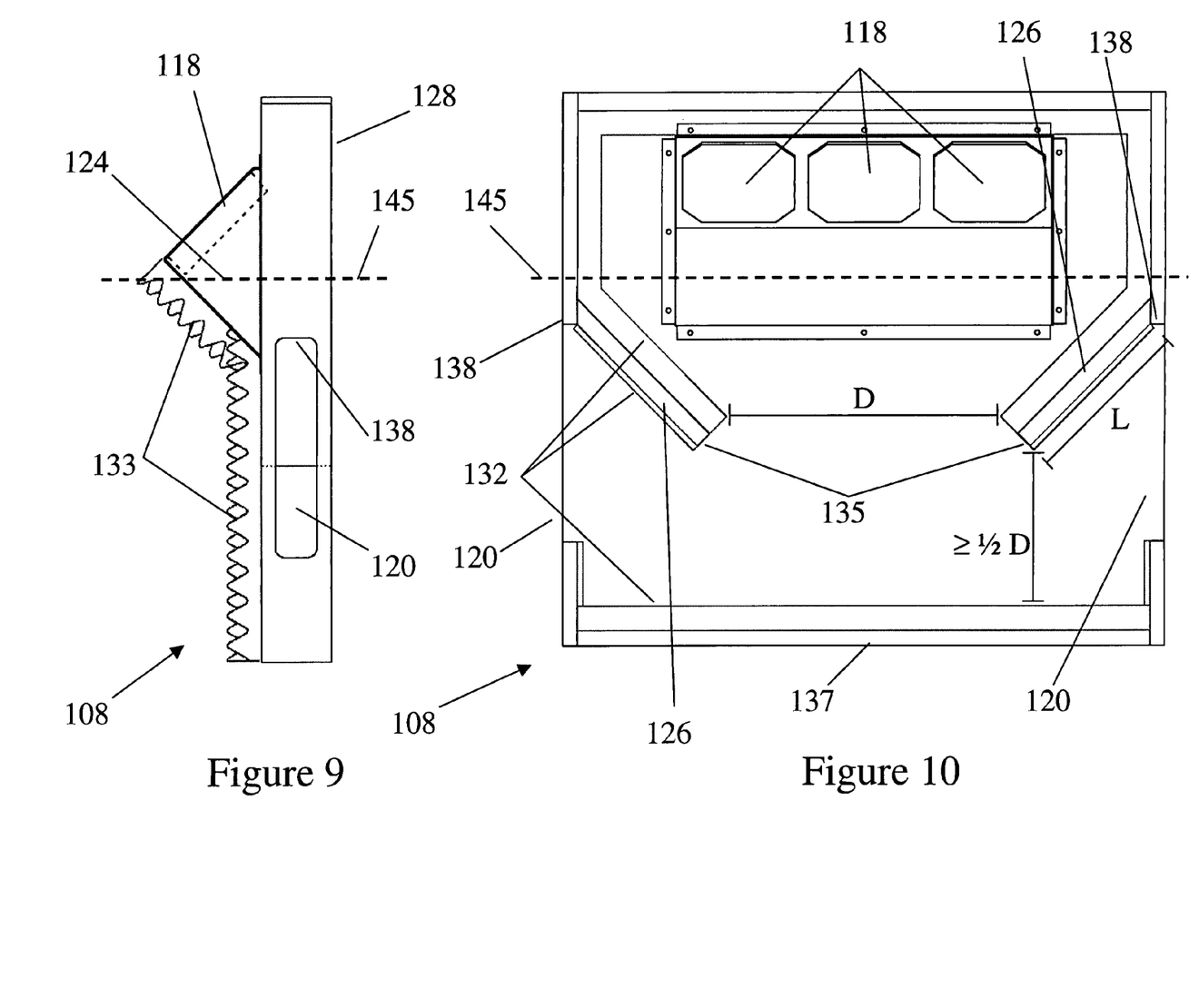
FIG. 9 shows a side view of an exhaust module constructed according to an embodiment of the present invention.
FIG. 10 shows a cut-away rear view of an exhaust module constructed according to an embodiment of the present invention.

Exhaust module 108 can have an angled fan mount 124, which is angled relative to a horizontal plane 145 extending through enclosure 100. Angled fan mount 124 forms a small channel that directs the air entering exhaust module 108 generally toward internal baffles 126. Angled fan mount 124 reduces the backpressure exerted on fans mounted in exhaust inlets 118 and increases the airflow through exhaust module 108 as compared to an exhaust module without angled fan mount 124. This aspect increases heat removal from enclosure 100. The selection of the angle of angled fan mount 124 relative to a rear wall 128 (as best shown in FIG. 9) is a compromise between increasing the airflow through enclosure 100 and reducing space occupied by angled fan mount 124 in enclosure 100. Angles of 30°-60° can be used successfully. The angle in the example embodiment is 45° relative to rear wall 128 of exhaust module 108.

Figure 8:
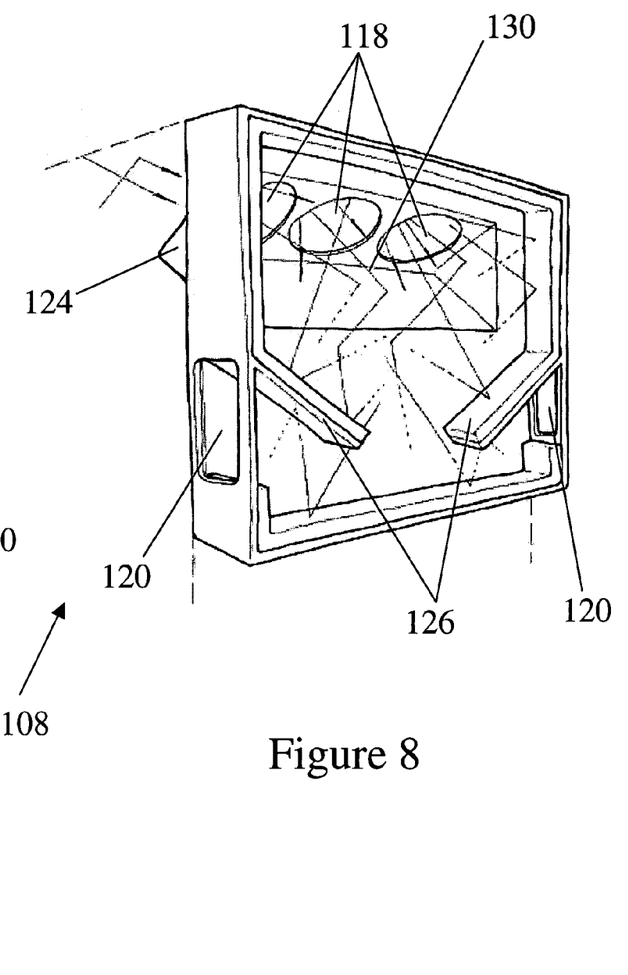
FIG. 8 shows a cut-away perspective view of an exhaust module constructed according to an embodiment of the present invention illustrating noise reflection within the module.

FIG. 8 shows the cut-away perspective view of exhaust module 108 of FIG. 7, illustrating noise reflections within exhaust module 108. Multi-segmented arrows generally illustrate example noise paths emanating from enclosure 100 and show noise reflections off the interior walls and internal baffles 126 of exhaust module 108. The angle of fan mount 124 aids in creating noise reflections by directing noise entering exhaust module 108 from enclosure 100 into rear wall 128 of exhaust module 108 (as best shown by FIG. 9). In addition, angled fan mount 124 holds fans mounted in exhaust inlets 118 spaced away from rear wall 128. This spacing reduces the noise energy transmitted to rear wall 128, resulting in reduced noise transmission by rear wall 128 outside of enclosure 100. Internal baffles 126 are disposed within exhaust module 108 to drastically reduce noise passing from exhaust inlets 118 to exhaust outlets 120. In this embodiment, internal baffles 126 are positioned so that there is not a line of sight between exhaust inlets 118 and exhaust outlets 120.

An example noise path 130 shows noise entering exhaust module 108 through exhaust inlet 118 and reflecting off of rear wall 128. The noise further reflects off of the interior surface of an opposite wall of exhaust module 108 and then reflects off of internal baffle 126. In this example, because the interior surface of exhaust module 108 and the surface of internal baffles 126 are treated with noise-absorbing or noise-abating material (as described in detail below), the noise loses energy with each reflection. If the noise eventually exits through exhaust outlets 120, its energy, and therefore its volume, is greatly reduced. In this way, embodiments of the present invention provide for the free-flow of air out of enclosure 100 while drastically reducing noise from escaping enclosure 100. As explained above in connection with intake module 106, the arrangement of internal baffles 126 is not limited to only what is shown in FIGS. 7 and 8. It is contemplated that additional baffles may be provided between exhaust inlets 118 and internal baffles 126 and/or between internal baffles 126 and exhaust outlets 120, and still be within the scope of the present invention.

FIG. 10 shows a cut-away rear view of exhaust module 108. As illustrated in FIG. 10, internal baffles 126 and the walls of exhaust module 108 can be constructed of or treated with materials similar to those used for the walls of intake modules 106 to render the walls and internal baffles 126 noise-absorbing. Noise-absorbing material 132 can cover internal baffles 126 as well as any other interior wall surface of exhaust module 108. Although not shown in FIG. 10, the walls of exhaust module 108 that lie in the plane of the page can also be covered with noise-absorbing material. Similarly, as shown in FIG. 9, surfaces 133 of the exhaust module that are exposed to the inside of enclosure 100 can be covered with noise-absorbing material. Covering these surfaces with noise-absorbing material increases the amount of noise energy absorbed inside of enclosure 100.

FIG. 10 also illustrates certain design aspects of internal baffles 126 of the example embodiment. Internal baffles 126 are angled such that the surface of internal baffles 126 are generally normal to exhaust inlets 118 when viewed in the 2-dimensional view presented in FIG. 10, thereby forming a funnel-shaped baffle arrangement. In the example embodiment, internal baffles 126 are at an angle of 45° relative to the horizontal. Other angles may be used, depending upon the position of the exhaust inlets 118. In addition, a length L of internal baffles 126 is selected to block a line of sight from right exhaust outlet 120 to the far left-hand edge of exhaust inlets 118 (the same being true with regard to the left exhaust outlet 120 and far right-hand edge of exhaust inlets 118). These aspects increase the likelihood of reflecting noise energy away from exhaust outlets 120.

Furthermore, ends 135 of internal baffles 126 are spaced apart by a distance D. Thus, in the example embodiment, internal baffles 126 are non-overlapping. Ends 135 are also spaced apart from a bottom wall 137 by a distance of at least one-half D. Thus, the total aperture formed by the two spaces between ends 135 of internal baffles 126 and bottom wall 137 is equal to or greater than the aperture formed by the space between ends 135 of internal baffles 126. Likewise, the total aperture formed by the two exhaust outlets 120 is equal to or greater than the aperture formed by the space between ends 135 of internal baffles 126. These aspects increase the airflow through exhaust module 108, thereby increasing the heat removal from enclosure 100.

FIG. 10 also illustrates that in the example embodiment, upper edges 138 of exhaust outlets 120 meet the base of internal baffles 126. This aspect of the embodiment prevents heat rising along the lower surface of internal baffles 126 from becoming trapped inside exhaust module 126.

Figures 11, 12:
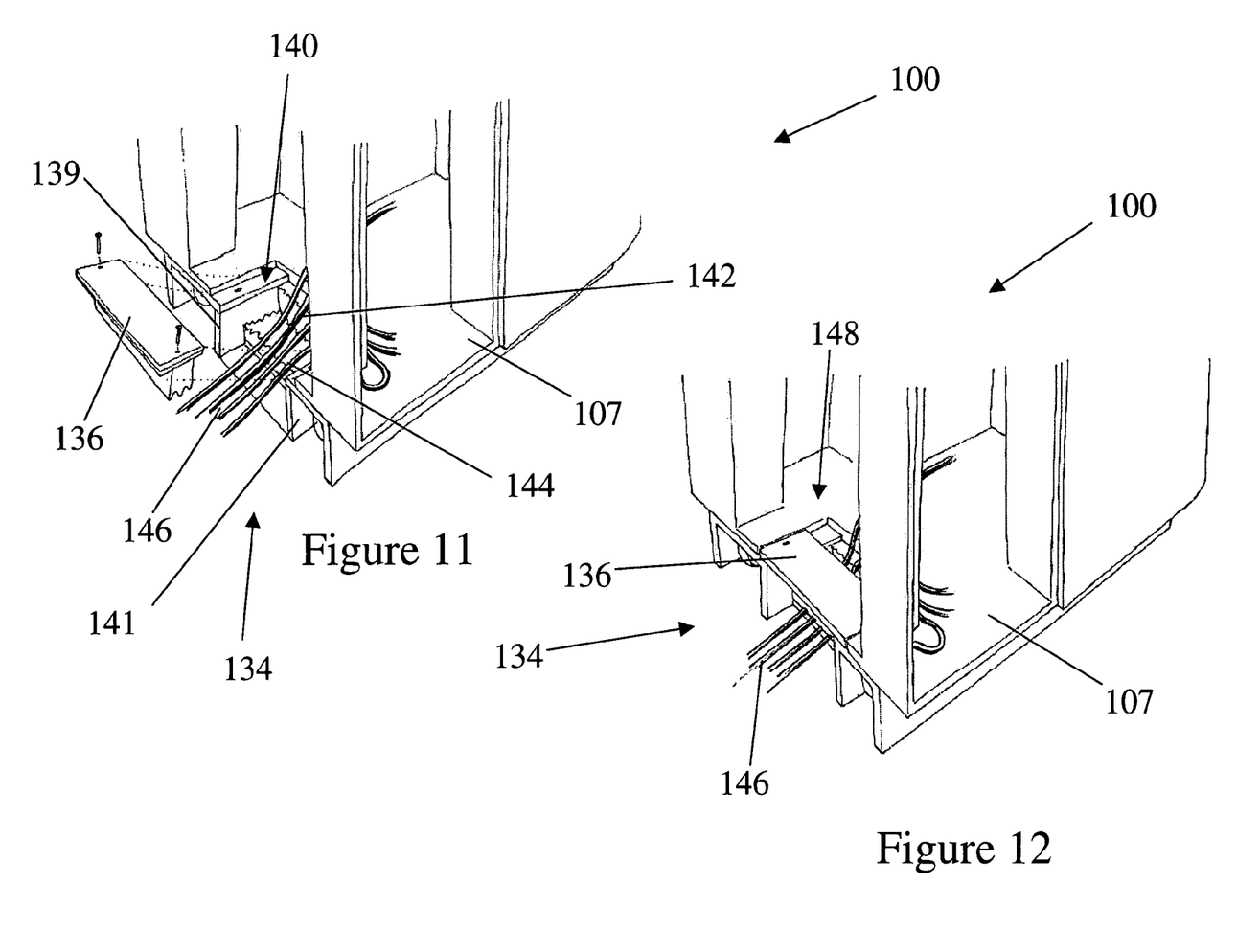
FIG. 11 shows a perspective cut-away view of an enclosure illustrating a cable egress port assembly in accordance with an embodiment of the present invention.
FIG. 12 shows the cable egress port assembly of FIG. 11 with a top cover secured in its place, illustrating a sealed egress port assembly.

FIG. 11 shows a perspective partial cut-away view of enclosure 100 illustrating a cable egress port 134 in accordance with the embodiment. To illustrate the structure of egress port 134, a top cover 136 is removed and spaced apart from the opening of egress port 134. Egress port 134 can be joined to floor 107 of enclosure 100 by various methods such that egress port 134 is removable or solidly attached. For example, egress port 134 can be joined to floor 107 of enclosure 100 by nuts and bolts, screws, or other fasteners, or, egress port 134 can be joined to floor 107 by welding, soldering, or gluing. One advantage of a detachable egress port 134 is that it can be removed before relocating enclosure 100, thereby avoiding possible damage to egress port 134 because of its proximity to the ground.

Egress port 134 has four sides: a left upright side 139, right upright side 141, a front upright side 142, and a bottom side 144. The sides are arranged so that when attached to floor 107 of enclosure 100, the three upright sides surround a hole in floor 107. The four sides of egress port 134 form a rear-upward facing opening 140. With top cover 136 removed, cables 146 can be placed into opening 140 of egress port 134 without the need to thread cables 146 through opening 140. This advantageously allows for placement of cables 146 having large end connectors without the need to first remove the connectors and replace the connectors once cables 146 are in position. Likewise, cables 146 can be easy removed from opening 140 of egress port 134 without having to modify end connectors present on cables 146.

The four sides of egress port 134 can be constructed of materials similar to those used for the walls of enclosure 100 described above. Likewise, the inside surfaces of the sides of egress port 134 can be treated or covered with materials that have noise-absorbing properties similar to those mentioned above. In the example embodiment, the inside surfaces of the sides of egress port 134 are coated with the TS3 1.8 mm thick flexible polymeric damping sheet described above to absorb vibration. Ten and/or 25 mm thick polyurethane foam is placed on top of the polymeric damping sheet covering the left and right upright sides. Egg box style polyurethane foam is placed on top of the polymeric damping sheet covering front upright side 142 and a portion of bottom side 144. Egg box style polyurethane foam is also placed on the underside of top cover 136 such that when top cover 136 is secured in its place, the polyurethane foam layers on top cover 136 and bottom side 144 are pressed together to form a noise-absorbing seal around cables 146. Small vertical slits can be made in the polyurethane foam on the top cover 136 to facilitate sealing around cables 146.

FIG. 12 shows cable egress port 134 of FIG. 11 with top cover 136 secured in its place, illustrating a sealed egress port assembly. A cable passage 148 remains open to enclosure 100 to allow cables 146 to enter enclosure 100. However, any noise entering cable passage 148 is prevented from exiting egress port 134 because of the arrangement of noise proofing materials described above.

The terms and expressions that are employed herein are terms of description and not of limitation. There is no intention in the use of such terms and expressions of excluding the equivalents of the feature shown or described, or portions thereof, it being recognized that various modifications are possible within the scope of the invention as claimed.

What is claimed is:

1. A ventilated housing for electronic equipment that at least abates noise generated by the electronic equipment disposed therein, the housing comprising:
   a housing structure that is capable of being closed except for at least one air ingress opening and at least one air egress opening;
   an air intake structure further comprising,
      an intake inlet for receiving outside air therethrough,
      an intake internal chamber in fluid communications with the intake inlet and an intake outlet,
      the intake outlet for exhausting air from the intake internal chamber and passing said air into the housing structure, with the intake outlet being aligned with the housing air ingress opening, and
      at least one intake baffle disposed and positioned within the intake internal chamber such that noise emanating from within the housing structure is substantially abated from exiting through the intake inlet;
   an air exhaust structure further comprising,
      an exhaust inlet having at least a portion that extends into the housing structure, with the exhaust inlet for receiving air passing from within the housing structure, and with the exhaust inlet further having a portion disposed at a first angle to a horizontal plane extending through the housing structure and aligned with the housing air egress opening,
      an exhaust internal chamber in fluid communications with the exhaust inlet and an exhaust outlet,
      the exhaust outlet for exhausting air from the exhaust internal chamber and passing air outside the air exhaust structure, and
      at least one funnel-shaped baffle arrangement disposed and positioned within the exhaust internal chamber, the baffle arrangement including at least two non-overlapping exhaust baffles, each exhaust baffle being separately connected to the exhaust internal chamber and respectively being disposed at a second and third angle to the horizontal plane extending through the housing structure, with the exhaust baffles having lower and upper ends, the separate lower ends being distal to the exhaust inlet and spaced a first predetermined distance apart, the separate upper ends being proximal to the exhaust inlet and spaced apart a second predetermined distance that is greater than the first predetermined distance, the exhaust baffles being disposed such that at least noise emanating from within the housing structure is abated from exiting through the exhaust outlet,
      wherein the funnel-shaped baffle arrangement includes a central axis disposed between the at least two non-overlapping exhaust baffles, and the exhaust outlet is defined by at least one opening lying in a plane substantially parallel to the central axis and substantially perpendicular to the horizontal plane extending through the housing structure;
   noise-abating material disposed on at least a portion of at least one of the intake baffle, the funnel-shaped baffle arrangement, internal walls of the intake internal chamber walls, internal walls of the exhaust internal chamber walls, or internal walls of the housing structure for abating noise emanating from the housing structure; and
   a device associated with the air intake, air exhaust, or housing structures for moving air between the outside of the housing structure and the inside of the housing structure through the air ingress opening.

2. The housing of claim 1, wherein the noise-abating material is at least one of a polymer foam, a polyurethane foam, an anti-resonant polymeric damping sheet, fiberglass, carpet, a rubber sheet, or a chlorinated polyethylene flexible sheet material.

3. The housing of claim 1, wherein the intake baffle is disposed so that other than a direct line of sight exists between the intake inlet and intake outlet.

4. The housing of claim 1, wherein at least one of the exhaust baffles is disposed so that other than a direct line of sight exists between the exhaust inlet and the exhaust outlet.

5. The housing of claim 1, wherein a first cross sectional area of the intake outlet is equal to or greater than a second cross sectional area of the intake inlet.

6. The housing of claim 5, wherein a third cross sectional area of an aperture formed by the intake baffle and the internal walls of the intake internal chamber is equal to or greater than the second cross sectional area of the intake inlet.

7. The housing of claim 1, wherein a first cross sectional area of the exhaust outlet is equal to or greater than a second cross sectional area of the exhaust inlet.

8. The housing of claim 7, wherein a third cross sectional area of an aperture formed by the exhaust baffles and the internal walls of the exhaust internal chamber is equal to or greater than the second cross sectional area of the exhaust inlet.

9. The housing of claim 1, wherein the air exhaust structure is removably joined to the housing structure.

10. The housing of claim 1, wherein the air exhaust structure is integrally formed with the housing structure.

11. The housing of claim 1, the housing structure further comprising at least a front upright side, a rear upright side, a left upright side, and a right upright side, with the intake outlet including at least one opening disposed to deliver air to a space adjacent to the front upright side.

12. The housing of claim 1, further comprising more than one air intake structure associated with the housing structure.

13. The housing of claim 1, further comprising more than one air exhaust structure associated with the housing structure.

14. The housing of claim 1, wherein the first angle is between about 30 degrees and about 60 degrees.

15. The housing of claim 14, wherein the first angle is about 45 degrees.

16. The housing of claim 1, wherein the second angle is between about 30 degrees and about 60 degrees.

17. The housing of claim 16, wherein the second angle is about 45 degrees.

18. The housing of claim 1, wherein the third angle is between about 30 degrees and about 60 degrees.

19. The housing of claim 18, wherein the third angle is about 45 degrees.

20. A ventilated housing for electronic equipment that at least abates noise generated by the electronic equipment disposed therein, the housing comprising:
    a housing structure that is capable of being closed except for at least one air ingress opening and at least one air egress opening;
    an air intake structure further comprising,
        an intake inlet for receiving outside air therethrough,
        an intake internal chamber in fluid communications with the intake inlet and an intake outlet,
        the intake outlet for exhausting air from the intake internal chamber and passing said air into the housing structure, with the intake outlet being aligned with the housing air ingress opening, and
        at least one intake baffle disposed and positioned within the intake internal chamber such that noise emanating from within the housing structure is substantially abated from exiting through the intake inlet:
    an air exhaust structure further comprising,
        an exhaust inlet having at least a portion that extends into the housing structure, with the exhaust inlet for receiving air passing from within the housing structure, and with the exhaust inlet further having a portion disposed at a first angle to a horizontal plane extending through the housing structure and aligned with the housing air egress opening,
        an exhaust internal chamber in fluid communications with the exhaust inlet and an exhaust outlet,
        the exhaust outlet for exhausting air from the exhaust internal chamber and passing air outside the air exhaust structure, and
        at least one funnel-shaped baffle arrangement disposed and positioned within the exhaust internal chamber, the baffle arrangement including at least two non-overlapping exhaust baffles, each exhaust baffle being separately connected to the exhaust internal chamber and respectively being disposed at a second and third angle to the horizontal plane extending through the housing structure, with the exhaust baffles having lower and upper ends, the separate lower ends being distal to the exhaust inlet and spaced a first predetermined distance apart, the separate upper ends being proximal to the exhaust inlet and spaced apart a second predetermined distance that is greater than the first predetermined distance, the exhaust baffles being disposed such that at least noise emanating from within the housing structure is abated from exiting through the exhaust outlet;
    noise-abating material disposed on at least a portion of at least one of the intake baffle, the funnel-shaped baffle arrangement, internal walls of the intake internal chamber walls, internal walls of the exhaust internal chamber walls, or internal walls of the housing structure for abating noise emanating from the housing structure;
    a device associated with the air intake, air exhaust, or housing structures for moving air between the outside of the housing structure and the inside of the housing structure through the air ingress opening; and
    a cable egress port the cable egress port further comprising,
        a port structure adapted to be received at a port opening in the housing structure, the port structure including an open back and top, and a removable cover;
        the removable cover being capable of being fixed to the port structure to accommodate a plurality of different sized cables; and
        noise-abating material being disposed inside the port structure and on the internal surface of the removable cover such that when the cover is fixed to the port structure, the noise-abating material disposed on the internal surface of the removable cover mates with the noise-abating material inside the port structure to substantially seal at least one cable passing through the port structure into the housing structure such that noise emanating from the housing structure is abated from exiting through the port structure.

21. The housing of claim 20, wherein the noise-abating material disposed on the internal surface of the removable cover is at least one of a polymer foam, a polyurethane foam, an anti-resonant polymeric damping sheet, fiberglass, carpet, a rubber sheet, or a chlorinated polyethylene flexible sheet material.

22. The housing of claim 20, wherein the noise-abating material disposed inside the port structure is at least one of a polymer foam, a polyurethane foam, an anti-resonant polymeric damping sheet, fiberglass, carpet, a rubber sheet, or a chlorinated polyethylene flexible sheet material.

* * * * *